US 11,612,982 B2

(12) United States Patent
Kimba

(10) Patent No.: US 11,612,982 B2
(45) Date of Patent: Mar. 28, 2023

(54) POLISHING METHOD AND POLISHING APPARATUS

(71) Applicant: EBARA CORPORATION, Tokyo (JP)

(72) Inventor: Toshifumi Kimba, Tokyo (JP)

(73) Assignee: EBARA CORPORATION, Tokyo (JP)

(*) Notice: Subject to any disclaimer, the term of this patent is extended or adjusted under 35 U.S.C. 154(b) by 393 days.

(21) Appl. No.: 16/801,693

(22) Filed: Feb. 26, 2020

(65) Prior Publication Data
US 2020/0282512 A1 Sep. 10, 2020

(30) Foreign Application Priority Data

Mar. 4, 2019 (JP) ............... JP2019-038173

(51) Int. Cl.
B24B 49/12 (2006.01)
B24B 49/04 (2006.01)
H01L 21/304 (2006.01)

(52) U.S. Cl.
CPC ............ B24B 49/12 (2013.01); B24B 49/045 (2013.01); H01L 21/304 (2013.01)

(58) Field of Classification Search
CPC ....... B24B 49/12; B24B 49/045; B24B 49/04; B24B 49/02; B24B 49/10; B24B 49/105; B24B 37/005; B24B 37/107; B24B 7/228; H01L 21/304; H01L 21/67092; H01L 21/67253; H01L 21/30625; H01L 22/12; H01L 22/24; G01B 11/06; G01B 2210/56; G01J 2001/4238; G01J 2001/4242; G01J 2003/2853; G01J 2003/4332; G01J 2003/4334; G01J 3/433

(Continued)

(56) References Cited

U.S. PATENT DOCUMENTS

2005/0030416 A1* 2/2005 Kametani ............ H04N 5/2256
348/370
2008/0297774 A1* 12/2008 Jiang ...................... G01B 11/06
356/123

(Continued)

FOREIGN PATENT DOCUMENTS

CN 106457507 A 2/2017
CN 109382755 A 2/2019

(Continued)

Primary Examiner — Joel D Crandall
Assistant Examiner — Michael A Gump
(74) Attorney, Agent, or Firm — BakerHostetler

(57) ABSTRACT

A polishing method capable of accurately measuring a film thickness of a substrate, such as a wafer, by enhancing light intensity of a flash-light source, such as a xenon flash lamp is disclosed. The polishing method includes: while an optical sensor head is moving across a substrate, causing a flash-light source to emit light plural times in a first exposure time of a light detector to direct the light to the substrate via the optical sensor head, capturing reflected light from the substrate by the light detector via the optical sensor head, further causing the flash-light source to emit light plural times in a second exposure time of the light detector to direct the light to the substrate via the optical sensor head, and capturing reflected light from the substrate by the light detector via the optical sensor head; generating a spectrum of the reflected light; and detecting a surface state of the substrate from the spectrum.

10 Claims, 5 Drawing Sheets

(58) Field of Classification Search
USPC .............................................................. 451/6
See application file for complete search history.

(56) References Cited

U.S. PATENT DOCUMENTS

| | | | |
|---|---|---|---|
| 2012/0019830 A1* | 1/2012 | Kimba | H01L 22/26 |
| | | | 356/445 |
| 2012/0196511 A1 | 8/2012 | David et al. | |
| 2015/0253198 A1* | 9/2015 | Bergen | G06V 20/584 |
| | | | 348/222.1 |
| 2016/0360074 A1* | 12/2016 | Winer | H04N 13/271 |
| 2017/0234797 A1* | 8/2017 | Kostamovaara | G01N 21/65 |
| | | | 356/301 |
| 2018/0095370 A1* | 4/2018 | Kashiwagi | H01L 21/027 |

FOREIGN PATENT DOCUMENTS

| | | | | |
|---|---|---|---|---|
| JP | 2005-073227 A | | 3/2005 | |
| JP | 2009-233853 A | | 10/2009 | |
| JP | 2009233853 A | * | 10/2009 | ........... B24B 37/013 |
| JP | 2012-028554 A | | 2/2012 | |
| JP | 2018-099772 A | | 6/2018 | |

* cited by examiner

POLISHING METHOD AND POLISHING APPARATUS

CROSS REFERENCE TO RELATED APPLICATION

This document claims priority to Japanese Patent Application Number 2019-038173 filed Mar. 4, 2019, the entire contents of which are hereby incorporated by reference.

BACKGROUND

Manufacturing processes of semiconductor devices include a process of polishing a dielectric film, e.g., $SiO_2$, and a process of polishing a metal film, e.g., copper or tungsten. Polishing of a wafer is performed using a polishing apparatus. The polishing apparatus typically includes a polishing table that supports a polishing pad, a polishing head configured to press a wafer against the polishing pad, and a slurry supply nozzle arranged to supply slurry onto the polishing pad. While the polishing table is rotating, the slurry is supplied onto the polishing pad on the polishing table, and the polishing head presses the wafer against the polishing pad. The wafer is placed in sliding contact with the polishing pad in the presence of the slurry. The surface of the wafer is planarized by a combination of a chemical action of the slurry and a mechanical action of abrasive grains contained in the slurry.

The polishing of the wafer is terminated when a thickness of a film (a dielectric film, a metal film, a silicon layer, etc.), constituting the surface of the wafer, reaches a predetermined target value. The polishing apparatus generally includes an optical surface-monitoring system to measure a thickness of a non-metallic film, such as a dielectric film or a silicon layer. This optical surface-monitoring system is configured to direct light emitted by a light source to a surface of a wafer, measure intensity of reflected light from the wafer with a spectrometer, and analyze a spectrum of the reflected light to determine the surface condition of the wafer (e.g., to measure a thickness of the wafer, or to detect removal of a film forming the surface of the wafer). See, for example, Japanese laid-open patent publication No. 2009-233853.

There has recently been a trend to use a xenon flash lamp as the light source. The xenon flash lamp is a pulsed light source having a lighting time on the order of several microseconds. FIG. 5 is a diagram showing a spectrum showing a relationship between light intensity and wavelength of the xenon flash lamp. The xenon flash lamp can emit light having multiple wavelengths of about 200 nm to 1100 nm.

However, as shown in FIG. 5, the light intensity in the wavelength range from 200 nm to 250 nm is low. Therefore, it is difficult for the optical surface-monitoring system to effectively measure the film thickness using the light in the range of short wavelengths.

SUMMARY OF THE INVENTION

Thus, according to embodiments, there are provided a polishing method and a polishing apparatus capable of accurately measuring a film thickness of a substrate, such as a wafer, by enhancing light intensity of a flash-light source, such as a xenon flash lamp.

Embodiments, which will be described below, relate to a polishing method and a polishing apparatus for polishing a substrate, such as a wafer, and particularly to a polishing method and a polishing apparatus for polishing a substrate while measuring a film thickness of the substrate with an optical surface-monitoring system.

In an embodiment, there is provided a polishing method of polishing a substrate, comprising: rotating a polishing table together with an optical sensor head optically coupled to a light detector and a flash-light source; polishing a substrate by pressing the substrate against a polishing pad on the polishing table while moving the optical sensor head across the substrate; while the optical sensor head is moving across the substrate, causing the flash-light source to emit light plural times in a first exposure time of the light detector to direct the light to the substrate via the optical sensor head, capturing reflected light from the substrate by the light detector via the optical sensor head, further causing the flash-light source to emit light plural times in a second exposure time of the light detector to direct the light to the substrate via the optical sensor head, and capturing reflected light from the substrate by the light detector via the optical sensor head; generating a spectrum of the reflected light; and detecting a surface state of the substrate from the spectrum.

In an embodiment, the number of times the flash-light source emits the light in the first exposure time is the same as the number of times the flash-light source emits the light in the second exposure time.

In an embodiment, the second exposure time is longer than the first exposure time.

In an embodiment, the first exposure time is an exposure time when the optical sensor head is moving across an edge portion of the substrate.

In an embodiment, the second exposure time is an exposure time when the optical sensor head is moving across a central portion of the substrate.

In an embodiment, there is provided a polishing apparatus for polishing a substrate, comprising: a polishing table for supporting a polishing pad; a table motor configured to rotate the polishing table; an optical sensor head located in the polishing table; a flash-light source and a light detector optically coupled to the optical sensor head; a polishing head configured to press a substrate against the polishing pad to polish the substrate; and an operation controller configured to control operations of the flash-light source and the light detector, the operation controller being configured to, while the optical sensor head is moving across the substrate, instruct the flash-light source to emit light plural times in a first exposure time of the light detector to direct the light to the substrate via the optical sensor head, instruct the light detector to capture reflected light from the substrate via the optical sensor head, further instruct the flash-light source to emit light plural times in a second exposure time of the light detector to direct the light to the substrate via the optical sensor head, and instruct the light detector to capture reflected light from the substrate via the optical sensor head, generate a spectrum of the reflected light, and detect a surface state of the substrate from the spectrum.

In an embodiment, the number of times the flash-light source emits the light in the first exposure time is the same as the number of times the flash-light source emits the light in the second exposure time.

In an embodiment, the second exposure time is longer than the first exposure time.

In an embodiment, the first exposure time is an exposure time when the optical sensor head is moving across an edge portion of the substrate.

In an embodiment, the second exposure time is an exposure time when the optical sensor head is moving across a central portion of the substrate.

According to the above-described embodiments, the flash-light source emits the light plural times during each exposure time of the light detector. Therefore, the light detector captures the reflected light from the substrate plural times in one exposure time. The intensities of the reflected light are superimposed in the light detector, and the intensity of the reflected light in each exposure time increases. The above-described embodiments can enhance the intensity of the reflected light in the wavelength range where the light intensity of the flash-light source is low, and can therefore achieve accurate measurement of the film thickness.

DESCRIPTION OF EMBODIMENTS

Figure 1:
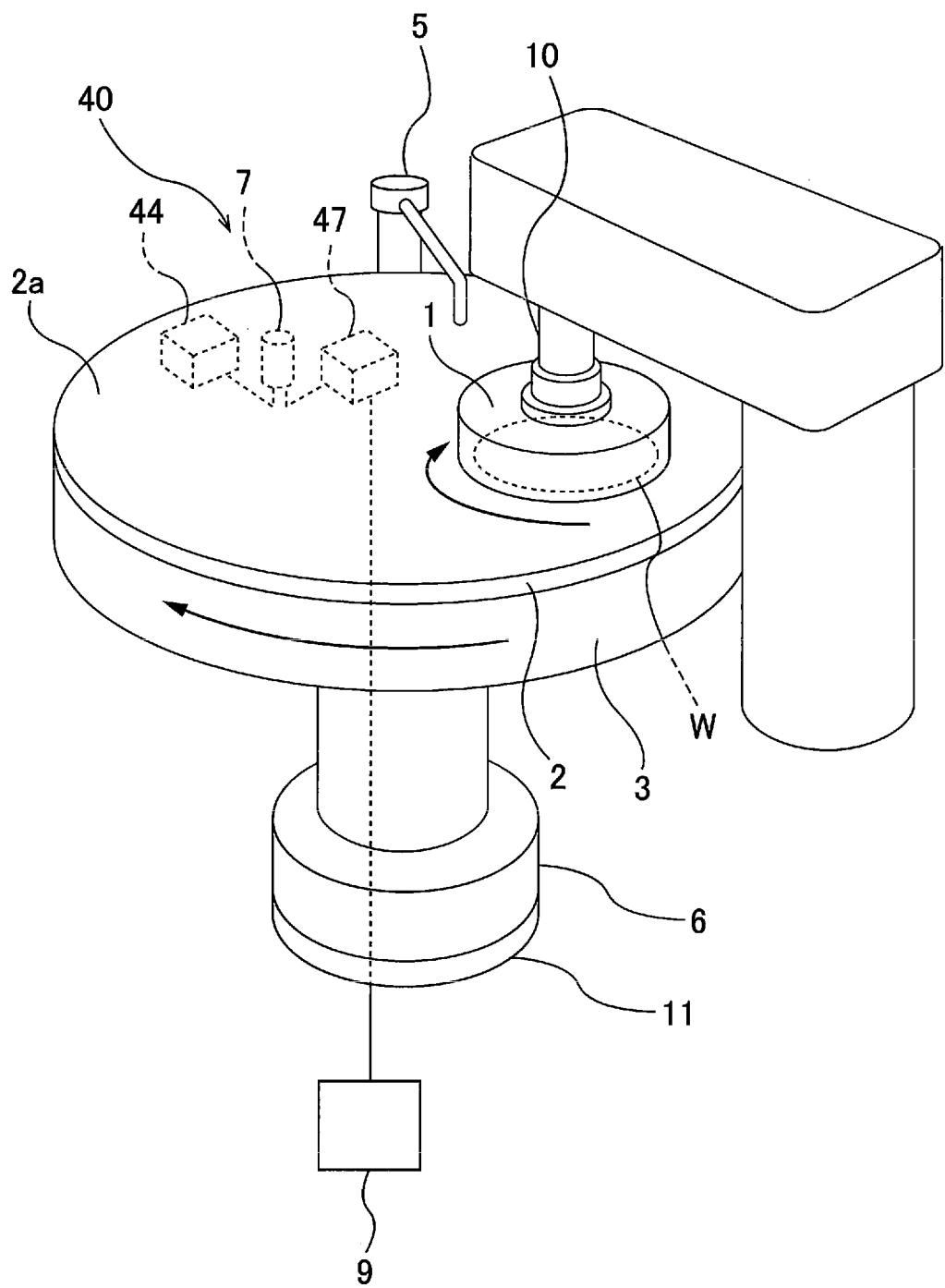
FIG. 1 is a schematic view showing an embodiment of a polishing apparatus.

Embodiments will be described below. FIG. 1 is schematic view showing an embodiment of a polishing apparatus. As shown in FIG. 1, the polishing apparatus includes a polishing table 3 for supporting a polishing pad 2, a polishing head 1 configured to press a wafer W, which is an example of a substrate, against the polishing pad 2, a table motor 6 configured to rotate the polishing table 3, and a slurry supply nozzle 5 arranged to supply slurry onto the polishing pad 2.

The polishing head 1 is coupled to a head shaft 10, and the polishing head 1 rotates together with the head shaft 10 in a direction indicated by an arrow. The polishing table 3 is coupled to the table motor 6, which is configured to rotate the polishing table 3 and the polishing pad 2 in a direction indicated by an arrow. The polishing apparatus includes a rotary encoder 11 configured to detect a rotation angle of the polishing table 3. The rotary encoder 11 is coupled to the table motor 6.

Polishing of the wafer W is performed as follows. The slurry supply nozzle 5 supplies the slurry onto a polishing surface 2a of the polishing pad 2 on the polishing table 3, while the polishing head 3 and the polishing head 1 are rotated in directions indicated by the arrows in FIG. 1. While the wafer W is being rotated by the polishing head 1, the wafer W is pressed against the polishing surface 2a of the polishing pad 2 in the presence of the slurry on the polishing pad 2. The surface of the wafer W is polished by a chemical action of the slurry and a mechanical action of abrasive grains contained in the slurry.

The polishing apparatus includes an optical surface-monitoring system 40 configured to detect a surface state of the wafer W. The optical surface-monitoring system 40 includes an optical sensor head 7, a flash-light source 44, a spectrometer 47, and an operation controller 9. The optical sensor head 7, the flash-light source 44, and the spectrometer 47 are secured to the polishing table 3, and rotate together with the polishing table 3 and the polishing pad 2. The position of the optical sensor head 7 is such that the optical sensor head 7 sweeps across the surface of the wafer W on the polishing pad 2 each time the polishing table 3 and the polishing pad 2 make one rotation.

Figure 2:
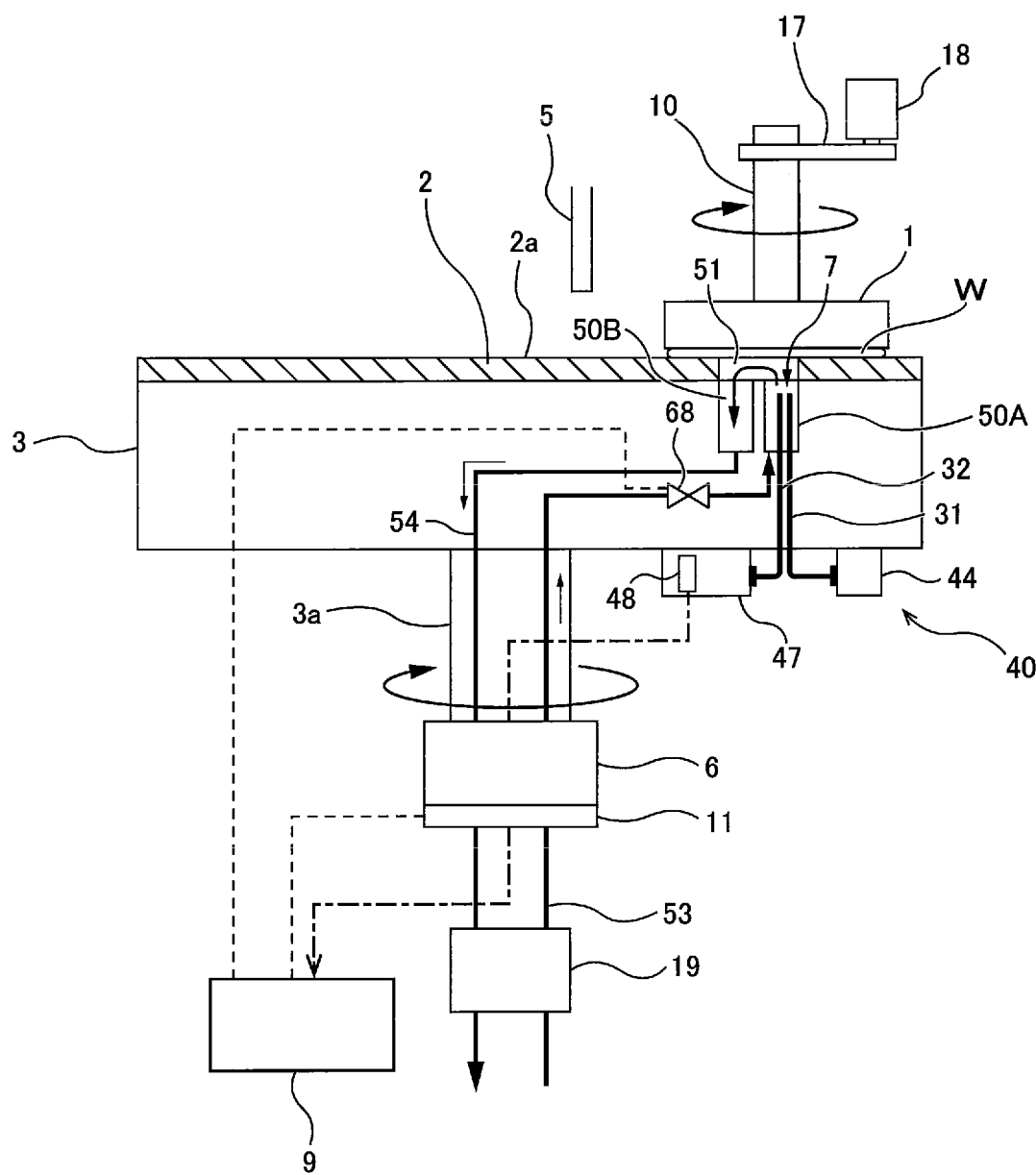
FIG. 2 is a cross-sectional view showing an embodiment of detailed configuration of the polishing apparatus shown in FIG. 1.

FIG. 2 is a cross-sectional view showing an embodiment of detailed configuration of the polishing apparatus shown in FIG. 1. The head shaft 10 is coupled to a polishing head motor 18 through a coupling device 17, such as belt, so that the head shaft 10 is rotated by the polishing head motor 18. This rotation of the head shaft 10 is transmitted to the polishing head 1 to rotate the polishing head 1 in the direction indicated by the arrow.

The spectrometer 47 includes a light detector 48. In one embodiment, the light detector 48 may be an image sensor, such as a CCD or CMOS. The optical sensor head 7 is optically coupled to the flash-light source 44 and the light detector 48. The light detector 48 is electrically coupled to the operation controller 9.

The optical surface-monitoring system 40 further includes a light-emitting optical fiber cable 31 arranged to direct the light, emitted by the flash-light source 44, to the surface of the wafer W, and a light-receiving optical fiber cable 32 arranged to receive the reflected light from the wafer W and transmit the reflected light to the spectrometer 47. An end of the light-emitting optical fiber cable 31 and an end of the light-receiving optical fiber cable 32 are located in the polishing table 3.

The end of the light-emitting optical fiber cable 31 and the end of the light-receiving optical fiber cable 32 constitute the optical sensor head 7 that directs the light to the surface of the wafer W and receives the reflected light from the wafer W. The other end of the light-emitting optical fiber cable 31 is coupled to the flash-light source 44, and the other end of the light-receiving optical fiber cable 32 is coupled to the spectrometer 47. The spectrometer 47 is configured to decompose the reflected light from the wafer W according to the wavelength and measure intensities of the reflected light over a predetermined wavelength range.

The flash-light source 44 transmits the light to the optical sensor head 7 through the light-emitting optical fiber cable 31, and the optical sensor head 7 emits the light to the wafer W. The reflected light from the wafer W is received by the optical sensor head 7 and transmitted to the spectrometer 47 through the light-receiving optical fiber cable 32. The spectrometer 47 decomposes the reflected light according to its wavelength and measures the intensity of the reflected light at each of the wavelengths. The spectrometer 47 sends measurement data of the intensity of the reflected light to the operation controller 9.

The operation controller 9 generates a spectrum of the reflected light from the measurement data of the intensity of the reflected light. This spectrum indicates a relationship between the intensity and the wavelength of the reflected light, and the shape of the spectrum varies according to a film thickness of the wafer W. The operation controller 9 determines the film thickness of the wafer W from the spectrum of the reflected light. A known technique is used to determine the film thickness of the wafer W from the spectrum of the reflected light. For example, Fourier transform is performed on the spectrum of the reflected light, and the film thickness is determined from a frequency spectrum obtained.

During polishing of the wafer W, the optical sensor head 7 emits the light to a plurality of measurement points on the wafer W and receives the reflected light from the wafer W while moving across the surface of the wafer W on the polishing pad 2 each time the polishing table 3 makes one rotation. The operation controller 9 determines the film thickness of the wafer W from the measurement data of the intensity of the reflected light, and controls an operation of polishing the wafer W based on the film thickness. For example, the operation controller 9 determines a polishing end point at which the film thickness of the wafer W reaches a target thickness.

In one embodiment, the operation controller 9 may detect a removal of a film that forms the surface of the wafer W from a change in the spectrum of the reflected light. In this case, the operation controller 9 may determine a polishing end point at which the film forming the surface of the wafer W is removed. The operation controller 9 may not determine the film thickness of the wafer W from the spectrum of the reflected light.

The polishing table 3 has a first hole 50A and a second hole 50B which open in an upper surface of the polishing table 3. The polishing pad 2 has a through-hole 51 at a position corresponding to the holes 50A and 50B. The holes 50A and 50B are in fluid communication with the through-hole 51, which opens in the polishing surface 2a. The first hole 50A is coupled to a liquid supply line 53. The second hole 50B is coupled to a drain line 54. The optical sensor head 7, composed of the end of the light-emitting optical fiber cable 31 and the end of the light-receiving optical fiber cable 32, is located in the first hole 50A, and is located below the through-hole 51.

In this embodiment, a xenon flash lamp is used as the flash-light source 44. The light-emitting optical fiber cable 31 is an optical transmission element for transmitting the light, emitted by the flash-light source 44, to the surface of the wafer W. The distal ends of the light-emitting optical fiber cable 31 and the light-receiving optical fiber cable 32 lie in the first hole 50A, and are located near the surface, to be polished, of the wafer W. The optical sensor head 7, composed of the distal end of the light-emitting optical fiber cable 31 and the distal end of the light-receiving optical fiber cable 32, is arranged so as to face the wafer W held by the polishing head 1, so that multiple measurement points of the wafer W are irradiated with the light each time the polishing table 3 makes one revolution. Only one optical sensor head 7 is provided in this embodiment, while a plurality of optical sensor heads 7 may be provided.

During polishing of the wafer W, each time the polishing table 3 makes one revolution, the optical sensor head 7 sweeps across the wafer W. While the optical sensor head 7 is located below the wafer W, the flash-light source 44 emits the light at predetermined intervals. The light is directed to the surface (i.e., the surface to be polished) of the wafer W through the light-emitting optical fiber cable 31, and the reflected light from the wafer W is received by the spectrometer 47 through the light-receiving optical fiber cable 32, and is captured by the light detector 48. The light detector 48 measures the intensity of the reflected light at each of the wavelengths over the predetermined wavelength range and sends the measurement data to the operation controller 9. The measurement data is a film thickness signal that changes according to the film thickness of the wafer W. The operation controller 9 generates a spectrum of the reflected light showing the light intensities at the respective wavelengths from the measurement data, and determines the film thickness of the wafer W from the spectrum of the reflected light.

During the polishing of the wafer W, pure water as a rinsing liquid is supplied into the first hole 50A through the liquid supply line 53, and further supplied into the through-hole 51 through the first hole 50A. The pure water fills a space between the surface (i.e., the surface to be polished) of the wafer W and the optical sensor head 7. The pure water flows into the second hole 50B and is discharged through the drain line 54. The pure water flowing in the first hole 50A and the through-hole 51 prevents the slurry from entering the first hole 50A, thereby securing an optical path.

The liquid supply line 53 and the drain line 54 are coupled to a rotary joint 19 and further extend in the polishing table 3. An end of the liquid supply line 53 is coupled to the first hole 50A. The other end of the liquid supply line 53 is coupled to a pure-water supply source (not shown). The pure water is supplied to the first hole 50A through the liquid supply line 53, and further supplied to the through-hole 51 through the first hole 50A.

An end of the drain line 54 is coupled to the second hole 50B. The pure water that has been supplied to the through-hole 51 flows into the second hole 50B, and is discharged through the drain line 54 to the outside of the polishing apparatus. An on-off valve 68 is attached to the liquid supply line 53. The on-off valve 68 is an electromagnetic valve or a motor driven valve. The on-off valve 68 is electrically coupled to the operation controller 9. The operation controller 9 periodically opens and closes the on-off valve 68 in synchronization with the rotation of the polishing table 3 during polishing of the wafer W. Specifically, when the wafer W is not present over the through-hole 51, the operation controller 9 closes the on-off valve 68, and when the wafer W is present over the through-hole 51, the operation controller 9 opens the on-off valve 68.

The rotary encoder 11 is electrically coupled to the operation controller 9. An output signal of the rotary encoder 11 (i.e., a detected value of the rotation angle of the polishing table 3) is sent to the operation controller 9. The operation controller 9 determines a relative position of the optical sensor head 7 with respect to the polishing head 1 from the output signal of the rotary encoder 11, i.e., the rotation angle of the polishing table 3, and controls light emission timings of the flash-light source 44 and light detection timings of the light detector 48 based on the relative position of the optical sensor head 7. The operation controller 9 includes at least one computer. The operation controller 9 includes a memory in which a program is stored, and an arithmetic device that performs calculations in accordance with instructions contained in the program. The memory includes a main memory, such as RAM, and an auxiliary memory, such as hard disk drive (HDD) or solid state drive (SSD). Examples of the arithmetic device include CPU (central processing unit) and GPU (graphic processing unit). It should be noted, however, the specific configurations of the operation controller 9 are not limited to the present embodiment.

During polishing of the wafer W, the operation controller 9 instructs the flash-light source 44 and the light detector 48 to control the light emitting operation of the flash-light source 44 and the light detecting operation of the light detector 48. Specifically, when the optical sensor head 7 is located below the wafer W, the operation controller 9 transmits light-emission trigger signals to the flash-light source 44, and transmits light-detection trigger signals to the light detector 48. Upon receiving each light-emission trigger signal, the flash-light source 44 emits the light instantaneously. Upon receiving each light-detection trigger signal, the light detector 48 starts capturing the reflected light. The light detector 48 stops capturing the reflected light when the transmission of the light-detection trigger signal is terminated.

The operation controller 9 generates the light-emission trigger signals and the light-detection trigger signals that are synchronized with each other. While the optical sensor head 7 is moving across the wafer W, the flash-light source 44 receives the plurality of light-emission trigger signals and emits the light plural times, and at the same time, the light detector 48 receives the plurality of light-detection trigger signals and captures the reflected light from the wafer W plural times. The number of light-emission trigger signals received by the flash-light source 44 while the optical sensor head 7 is moving across the wafer W is larger than the number of light-detection trigger signals received by the light detector 48. Specifically, the number of times the flash-light source 44 emits the light while the optical sensor head 7 is moving across the wafer W is larger than the number of times the light detector 48 captures the reflected light.

Figure 3:
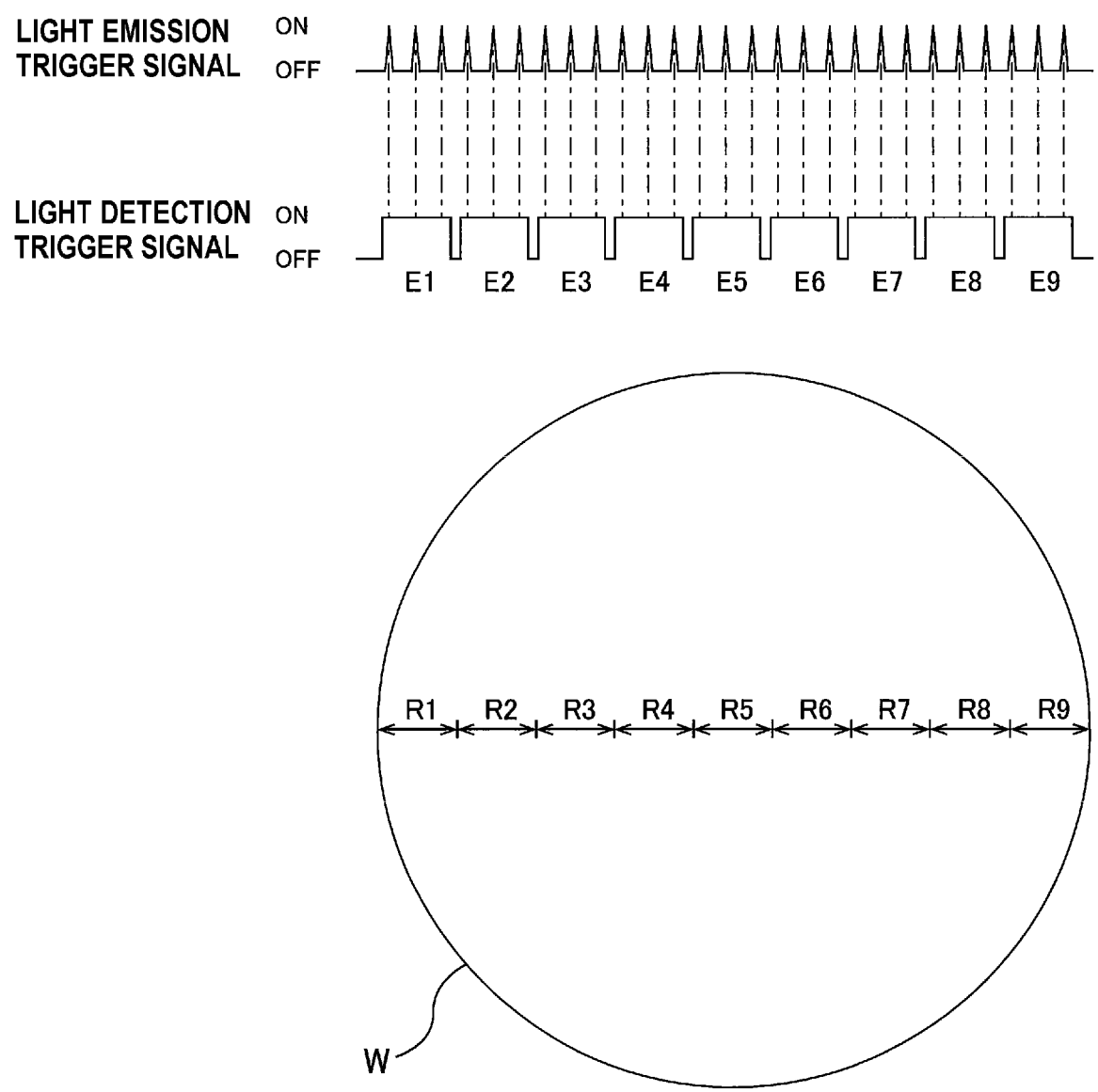
FIG. 3 is a diagram showing an embodiment of light emission timings of a flash-light source and light detection timings of a light detector.

FIG. 3 is a diagram showing an embodiment of the light emission timings of the flash-light source 44 and the light detection timings of the light detector 48. In the embodiment shown in FIG. 3, while the optical sensor head 7 is moving across the wafer W, the flash-light source 44 emits the light 27 times, and the light detector 48 captures the reflected light nine times. As can be seen from FIG. 3, the light-detection trigger signals are synchronized with the light-emission trigger signals.

In this specification, a period of time per one operation of capturing the reflected light performed by the light detector 48 is referred to as exposure time. During the exposure time, the light detector 48 keeps capturing the reflected light (or keeps detecting the reflected light). The light detector 48 has an electronic shutter function. Specifically, when the light detector 48 receives the light-detection trigger signal, the electronic shutter opens. When the transmission of the light-detection trigger signal is stopped, the electronic shutter closes. A period of time from when the electronic shutter opens to when the electronic shutter closes is the exposure time.

In the embodiment shown in FIG. 3, there are nine exposure times E1 to E9 during a period of time when the optical sensor head 7 is moving across the wafer W (hereinafter referred to as one scan time). These nine exposure times E1 to E9 have the same length. The nine exposure times E1 to E9 are exposure times when the optical sensor head 7 is moving across nine regions R1 to R9 on the wafer W. The regions R1 and R9 are edge portions of the wafer W, the regions R4, R5 and R6 are central portions of the wafer W, and the regions R2, R3, R7 and R8 are intermediate portions located between the edge portions and the central portions of the wafer W.

The number of times the flash-light source 44 emits the light in each of the exposure times E1 to E9 is the same. In the present embodiment, the flash-light source 44 emits the light three times in one exposure time. Therefore, the light detector 48 captures the reflected light three times in one exposure time. The intensities of the reflected light are superimposed in the light detector 48, so that the intensity of the reflected light in each exposure time increases. The polishing apparatus according to the present embodiment can enhance the intensity of the reflected light in the wavelength range where the intensity of the light from the flash-light source 44 is low. As a result, accurate measurement of the film thickness can be achieved.

According to the present embodiment, film thickness information contained in a plurality of reflected lights detected in one exposure time is superimposed. Since a variation in the intensities of the plurality of reflected lights detected in each exposure time is small, the accuracy of determining the film thickness does not substantially decrease. According to the present embodiment, the intensities of the plurality of reflected lights are superimposed. This results in substantially the same effect as averaging the intensities of the reflected light.

In the present embodiment, the nine exposure times E1 to E9 exist in one scan time of the optical sensor head 7, while the present invention is not limited to this embodiment. In one embodiment, eight or less exposure times may be present in one scan time of the optical sensor head 7. In another embodiment, ten or more exposure times may be present in one scan time of the optical sensor head 7.

Figure 4:
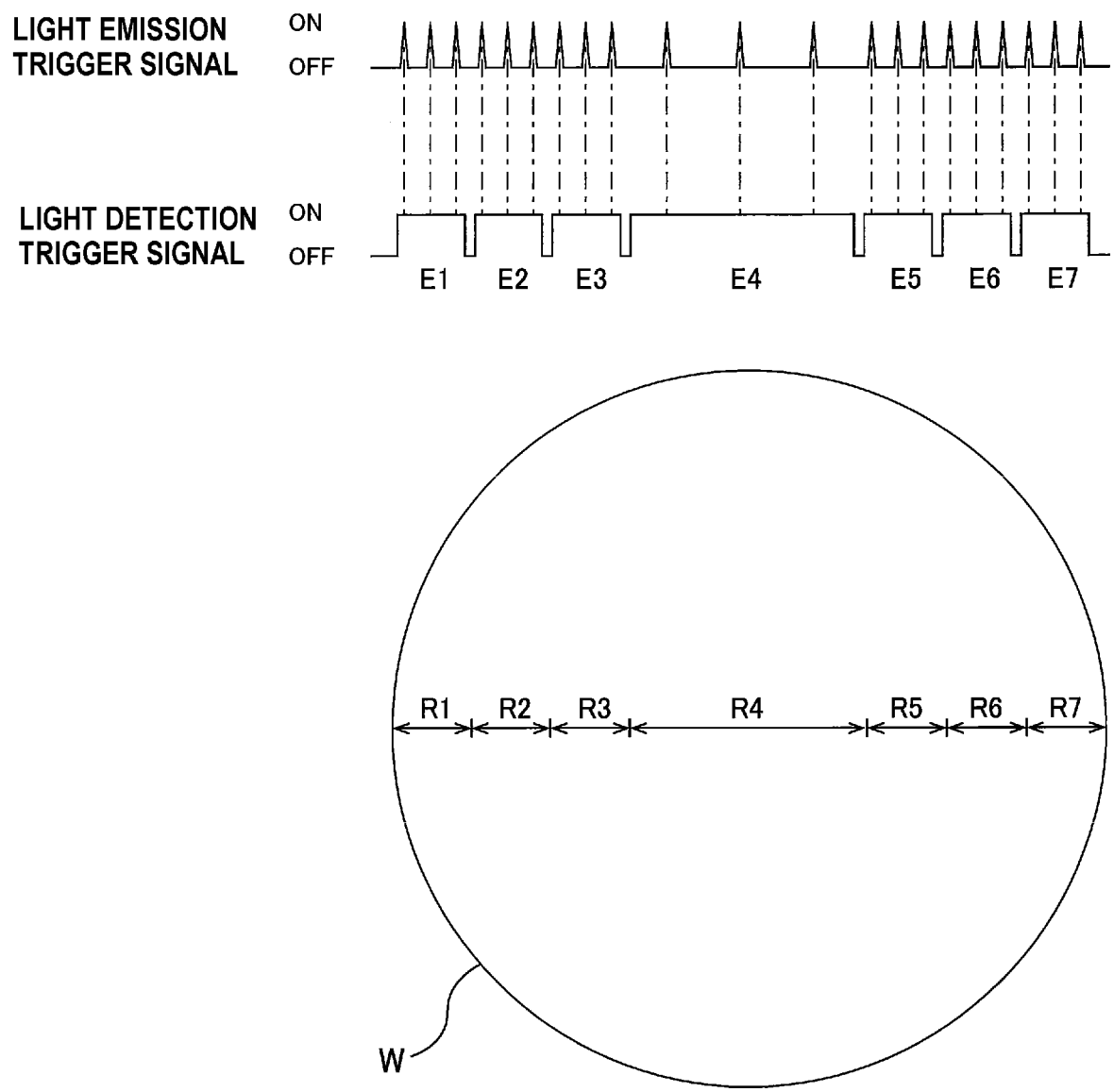
FIG. 4 is a diagram showing another embodiment of light emission timings of the flash-light source and light detection timings of the light detector.
Figure 5:
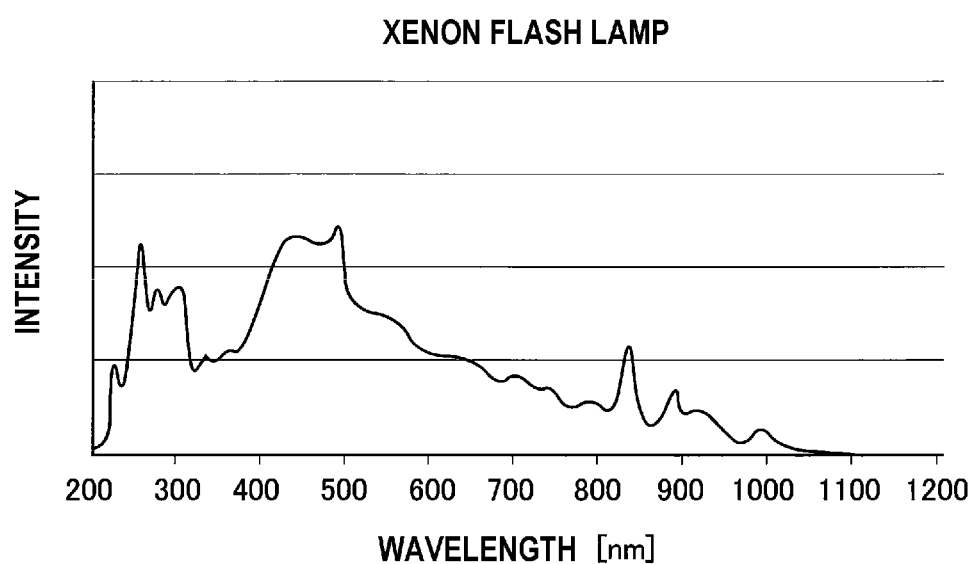
FIG. 5 is a diagram showing a spectrum showing a relationship between light intensity and wavelength of a xenon flash lamp.

FIG. 4 is a diagram showing another embodiment of the light emission timings of the flash-light source 44 and the light detection timings of the light detector 48. The details of the present embodiment, which are not particularly described, are the same as those of the embodiment described with reference to FIG. 3, and thus their repetitive descriptions are omitted. In the embodiment shown in FIG. 4, seven exposure times E1 to E7 exist in one scan time of the optical sensor head. The seven exposure times E1 to E7 are exposure times when the optical sensor head 7 is moving across seven regions R1 to R7 on the wafer W. The regions R1 and R7 are edge portions of the wafer W, the region R4 is a central portion of the wafer W, and the regions R2, R3, R5, and R6 are intermediate portions located between the edge portions and the central portions of the wafer W.

The number of times the flash-light source 44 emits the light in each of the exposure times E1 to E7 is the same, but the exposure time E4 is longer than each of the other exposure times E1, E2, E3, E5, E6, and E7.

The exposure time E4 is an exposure time when the optical sensor head 7 is moving across the central portion R4 of the wafer W. Typically, a film thickness profile of the wafer W is substantially constant at the central portion R4 of the wafer W. Therefore, even if the exposure time E4 corresponding to the central portion R4 of the wafer W is longer than the other exposure times, the longer exposure time E4 hardly affects the control of the film thickness profile of the wafer W. According to the present embodiment, the number of times the flash-light source 44 emits the light in one scan time of the optical sensor head 7 is reduced, so that the life of the flash-light source 44 is extended. Moreover, since the amount of film thickness data acquired in one scan time of the optical sensor head 7 is reduced, the processing load on the operation controller 9 can be reduced.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing method of polishing a substrate, comprising:
    rotating a polishing table together with an optical sensor head optically coupled to a light detector and a flash-light source;
    polishing the substrate by pressing the substrate against a polishing pad on the polishing table while moving the optical sensor head across the substrate;
    while the optical sensor head is moving across the substrate, causing the flash-light source to emit a first light plural times in a first exposure time of the light detector to direct the first light to the substrate via the optical sensor head, capturing first reflected light from the substrate by the light detector via the optical sensor head, further causing the flash-light source to emit a second light plural times in a second exposure time of the light detector to direct the second light to the substrate via the optical sensor head, and capturing second reflected light from the substrate by the light detector via the optical sensor head, the second exposure time being longer than the first exposure time, a number of times the flash-light source emits the first light in the first exposure time being the same as a number of times the flash-light source emits the second light in the second exposure time;

generating spectra of the first reflected light and the second reflected light; and detecting a surface state of the substrate from the spectra.

2. The polishing method according to claim 1, wherein the first exposure time is an exposure time when the optical sensor head is moving across an edge portion of the substrate.

3. The polishing method according to claim 1, wherein the second exposure time is an exposure time when the optical sensor head is moving across a central portion of the substrate.

4. The polishing method according to claim 1, wherein time intervals of emitting the first light and time intervals of the second light are changed while the optical sensor head is moving across the substrate.

5. The polishing method according to claim 1, wherein time intervals of emitting the second light in the second exposure time is longer than time intervals of emitting the first light in the first exposure time.

6. A polishing apparatus for polishing a substrate, comprising:
- a polishing table for supporting a polishing pad;
- a table motor configured to rotate the polishing table;
- an optical sensor head located in the polishing table;
- a flash-light source and a light detector optically coupled to the optical sensor head;
- a polishing head configured to press the substrate against the polishing pad to polish the substrate; and
- an operation controller configured to control operations of the flash-light source and the light detector, the operation controller being configured to,
    - while the optical sensor head is moving across the substrate, instruct the flash-light source to emit a first light plural times in a first exposure time of the light detector to direct the first light to the substrate via the optical sensor head, instruct the light detector to capture first reflected light from the substrate via the optical sensor head, further instruct the flash-light source to emit a second light plural times in a second exposure time of the light detector to direct the second light to the substrate via the optical sensor head, and instruct the light detector to capture second reflected light from the substrate via the optical sensor head, the second exposure time being longer than the first exposure time, a number of times the flash-light source emits the first light in the first exposure time being the same as a number of times the flash-light source emits the second light in the second exposure time,
    - generate spectra of the first reflected light and the second reflected light, and
    - detect a surface state of the substrate from the spectra.

7. The polishing apparatus according to claim 6, wherein the first exposure time is an exposure time when the optical sensor head is moving across an edge portion of the substrate.

8. The polishing apparatus according to claim 6, wherein the second exposure time is an exposure time when the optical sensor head is moving across a central portion of the substrate.

9. The polishing apparatus according to claim 6, wherein time intervals of emitting the first light and time intervals of the second light are changed while the optical sensor head is moving across the substrate.

10. The polishing apparatus according to claim 6, wherein time intervals of emitting the second light in the second exposure time is longer than time intervals of emitting the first light in the first exposure time.

* * * * *